United States Patent
Alshareef et al.

(10) Patent No.: US 7,682,988 B2
(45) Date of Patent: Mar. 23, 2010

(54) THERMAL TREATMENT OF NITRIDED OXIDE TO IMPROVE NEGATIVE BIAS THERMAL INSTABILITY

(75) Inventors: Husam N. Alshareef, Austin, TX (US); Rajesh Khamankar, Coppell, TX (US); Ajith Varghese, McKinney, TX (US); Cathy A. Chancellor, Wylie, TX (US); Anand Krishnan, Farmers Branch, TX (US); Malcolm J. Bevan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/930,230

(22) Filed: Aug. 31, 2004

(65) Prior Publication Data
US 2006/0046514 A1 Mar. 2, 2006

(51) Int. Cl.
*H01L 21/31* (2006.01)
*H01L 21/469* (2006.01)
*H01L 21/8234* (2006.01)

(52) U.S. Cl. .................. 438/775; 438/770; 438/769; 438/275

(58) Field of Classification Search .......... 438/775, 438/769, 770, 771, 772, 773, 774, 275, 407, 438/283, 294, 765
See application file for complete search history.

(56) References Cited

U.S. PATENT DOCUMENTS

| | | | | |
|---|---|---|---|---|
| 5,508,212 A | * | 4/1996 | Wang et al. | 438/305 |
| 5,521,127 A | * | 5/1996 | Hori | 438/770 |
| 6,323,519 B1 | * | 11/2001 | Gardner et al. | 257/336 |
| 6,737,362 B1 | * | 5/2004 | Chen et al. | 438/776 |
| 7,067,176 B2 | * | 6/2006 | Das et al. | 427/377 |
| 2002/0074612 A1 | * | 6/2002 | Bulucea et al. | 257/402 |
| 2003/0003656 A1 | * | 1/2003 | Dong et al. | 438/257 |
| 2004/0248392 A1 | * | 12/2004 | Narwankar et al. | 438/584 |

OTHER PUBLICATIONS

Dieter K. Schroder, et al.; "Negative Bias Temperature Instability: Road To Cross In Deep Submicron Silicon Semiconductor Manufacturing"; Journal of Applied Physics, vol. 94, No. 1, Jul. 1, 2003, pp. 1-18.

* cited by examiner

*Primary Examiner*—Chuong A. Luu
(74) *Attorney, Agent, or Firm*—Jacqueline J. Garner; Wade J. Brady, III; Frederick J. Telecky, Jr.

(57) ABSTRACT

A method of reducing threshold voltage shift of a MOSFET transistor resulting after temperature and voltage stress, and an integrated circuit device fabricated according to the method. The method includes the steps of forming a nitrided dielectric layer on a semiconductor substrate, and subjecting the nitrided dielectric layer to an anneal at low pressure.

21 Claims, 3 Drawing Sheets

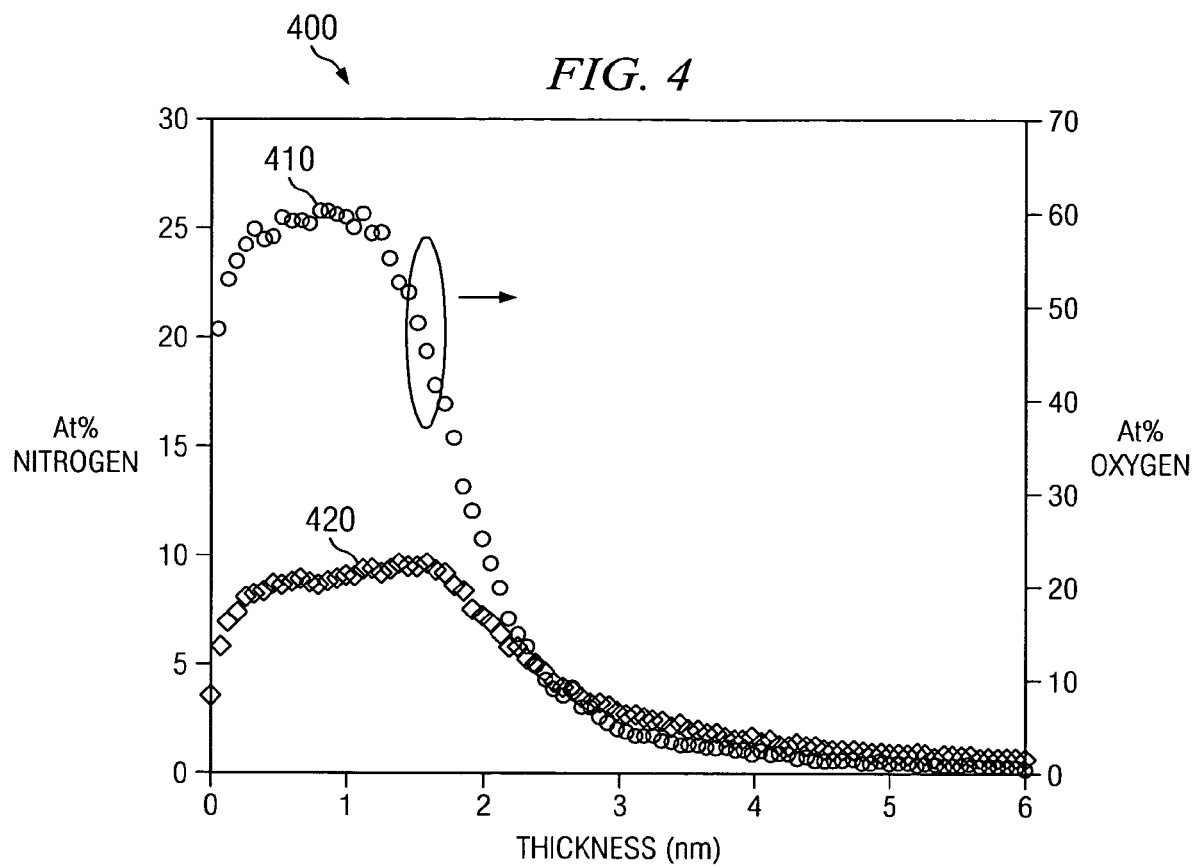
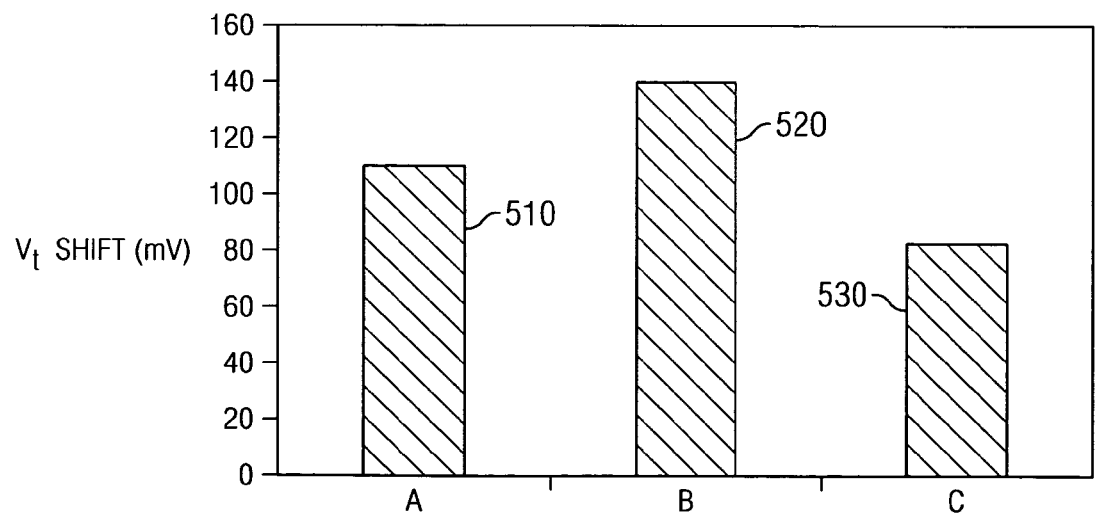

US 7,682,988 B2

THERMAL TREATMENT OF NITRIDED OXIDE TO IMPROVE NEGATIVE BIAS THERMAL INSTABILITY

TECHNICAL FIELD OF THE INVENTION

The present invention is directed, in general, to a method for manufacturing a semiconductor device, and, more specifically, to a method for reducing transistor threshold voltage instability without sacrificing device performance.

BACKGROUND OF THE INVENTION

High performance integrated circuits (ICs) have gained wide acceptance and utility in present day computing and telecommunications applications. Consumer demand has resulted in increasing functionality and speed of ICs, which is made possible by the steady shrinking of transistor feature sizes. These smaller transistors offer performance benefits, such as faster speed of operation and lower power, as well as lower cost. However, smaller features result in physical effects that must be compensated for in the processing of the IC device, and these compensating processes can introduce reliability concerns.

The reduction of transistor size demands reduction of transistor feature dimensions, such as the gate oxide thickness, $T_{ox}$, and gate and channel length. Reduction of $T_{ox}$ is necessary to raise the capacitance of the gate as the transistor threshold voltage, $V_t$, is reduced as the transistor is scaled down. However, the channel length of state-of-the-art metal oxide semiconductor field effect transistors (MOSFETs) has been reduced to dimensions at which short channel effects have an increasing effect on transistor performance. This effect leads to a higher transistor $V_t$ than would otherwise be necessary from scaling alone, and requires an increasing gate electric field strength, $E_{ox}$, with each transistor technology generation.

Higher $E_{ox}$ results in greater stress on the gate dielectric and on the interface between the gate dielectric and the channel. The quality of this interface is critical to the reliability of the transistor, as changes at the interface can cause undesirable changes of the transistor performance characteristics, such as increased $V_t$ and off current, and decreased saturated drain current and transconductance. These effects occur primarily on p-MOSFETS (equivalently known as p-channel MOSFETS), and are known as Negative Bias Temperature Instability, or NBTI.

NBTI is produced by thermal or voltage stress, but their combination is particularly effective in producing the effect. The activation temperature can be as low as 100° C., and the minimum necessary gate field strength is below 6 MV/cm. These are conditions routinely experienced by MOSFET transistors in current generation integrated circuits. The changes in transistor performance can significantly degrade circuit performance by causing changes in circuit timing, resulting in increased error rates or even device failure.

The root cause of NBTI is the formation of trapped charge at the interface between the gate oxide and the channel, which results from the removal of hydrogen at the interface between the channel and the gate dielectric. Hydrogen may be incorporated in the interface fortuitously as a result of hydrogen containing processes during fabrication, and is intentionally introduced at the end of the fabrication process with a forming gas anneal to passivate dangling bonds at the gate oxide-channel interface. These dangling bonds are a consequence of the lattice mismatch between crystalline silicon in the channel and amorphous silicon dioxide in the gate dielectric, and will result in trapped charge at the interface unless suitably passivated.

Several techniques to reduce NBTI are known, including fluorine implantation of the channel and modification of nitrogen content of nitrided gate oxide. Fluorine implantation, while effective at stabilizing the interface, introduces other detrimental effects, such as enhanced boron diffusion in the gate oxide and higher junction leakage. Reducing the nitrogen content of the gate also improves NBTI, but this must be weighed against the benefits of nitriding the gate, such as increased dielectric constant and reduction of boron diffusion through the gate dielectric.

Accordingly, what is needed in the art is a method of fabricating a semiconductor device that reduces NBTI effects while limiting the detrimental effects on transistor performance.

SUMMARY OF THE INVENTION

To address the above-discussed deficiencies of the prior art, the present invention provides, in one embodiment, a method of manufacturing a semiconductor device comprising, forming a nitrided dielectric layer on a semiconductor substrate, and subjecting the nitrided dielectric layer to an anneal at low pressure.

In another embodiment, the present invention provides a method of manufacturing an integrated circuit. This embodiment includes the steps of forming a nitrided gate dielectric layer on a semiconductor substrate, subjecting the nitrided gate dielectric layer to an anneal at low pressure to form an annealed gate dielectric layer. This embodiment further includes forming a gate layer over the annealed gate dielectric layer, forming wells and source/drains in the semiconductor substrate, patterning the gate layer and the annealed gate dielectric layer to form transistor gates, placing dielectric layers over the transistor gates, and forming interconnects in the dielectric layers that interconnect the transistor gates to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIG. 4 is a graph showing the concentration of oxygen and nitrogen as a function of depth from the surface of an exemplary gate dielectric formed according to the principles of the invention;

FIG. 5 is a graph showing the change of the threshold voltage of three PMOS transistors after thermal and voltage stress: A, with no anneal after nitridation; B, with high pressure anneal in 20% $O_2$/80% $N_2$, and C, with low pressure anneal in 100% $O_2$ after nitridation, and;

DETAILED DESCRIPTION

The present invention uniquely recognizes that threshold voltage shift, induced by temperature and voltage stress, of a MOSFET transistor fabricated with a nitrided gate dielectric can be significantly reduced by subjecting the gate dielectric to a thermal anneal in a gas mixture comprising oxygen at low pressure.

Figure 1:
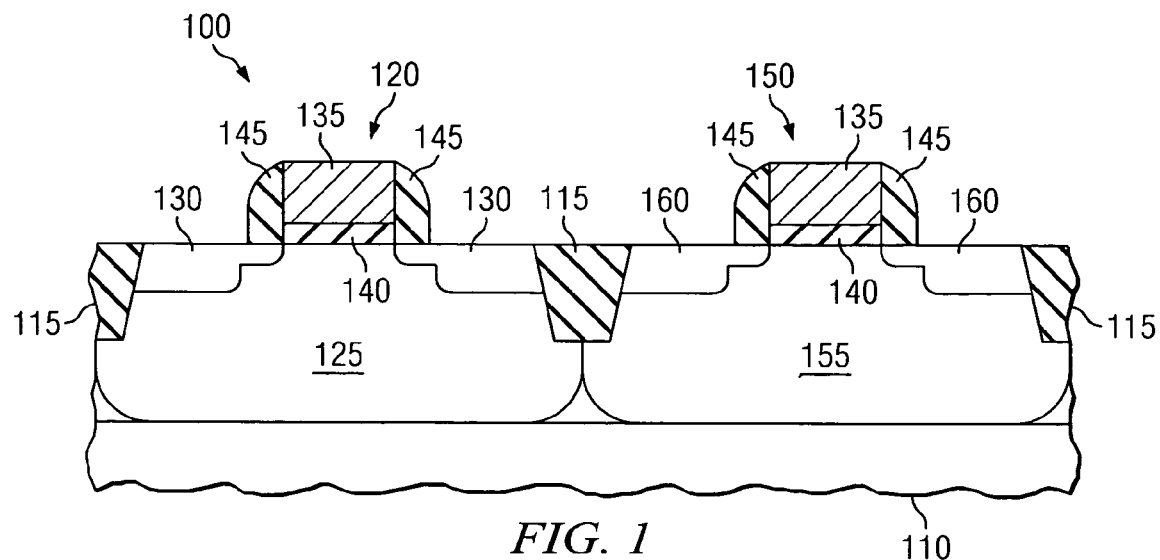
FIG. 1 illustrates a sectional view of an exemplary p-channel and n-channel transistor pair formed according to the principles of the invention.

Turning initially to FIG. 1, an exemplary cross section 100 is shown of two complementary MOSFET transistors, n-channel transistor 120 and p-channel transistor 150 after completion of transistor formation on substrate 110, but prior to interconnect processing. Though a complementary structure is used for this example, the transistors need not be complementary. Suitable substrates include silicon and gallium arsenide, e.g., but any semiconductor suitable for MOSFET device fabrication is within the scope of this invention.

Focusing initially on n-channel transistor 120, p-well 125 and source/drain regions 130 are formed by conventional ion implantation and diffusion processes. The transistor dimensions and process parameters used are chosen to achieve a particular transistor performance specification, and the present invention fully encompasses the embodiments resulting from these design choices. Sidewall spacers 145 are also conventionally formed. Typically, these spacers comprise silicon nitride, and may be formed by conventional deposition process, such as chemical vapor deposition, but other deposition processes are also within the scope of the invention. The gate 135 is formed by deposition and selective removal of a suitable conductive material which may be polysilicon. The gate is separated from p-well 125 by gate dielectric 140, which may be formed by thermal oxidation of the semiconductor substrate, with subsequent selective removal of the resulting oxide. The gate dielectric is of particular interest to the present invention, and will be discussed in detail below.

The p-channel transistor 150 is similar in structure to the n-channel transistor, with complementary doping of equivalent features. Shown are n-well 155, source/drain regions 160, gate dielectric 140, gate 135 and sidewall spacers 145. The transistors are isolated from each other by isolation regions 115, which are conventionally formed, and may consist of shallow trench isolation (STI), LOCOS, or other suitable means of isolation.

While the n-channel and p-channel transistors use complementary doping and operate with opposite polarity of gate voltage, they are structurally identical within the scope of this invention. As the NBTI effect occurs primarily in p-channel transistors, further description of the preferred and alternate embodiments will focus exclusively on the p-channel transistor for clarity. However, it is implicit that the present invention is applied to the n-channel transistor as well.

Figure 2:
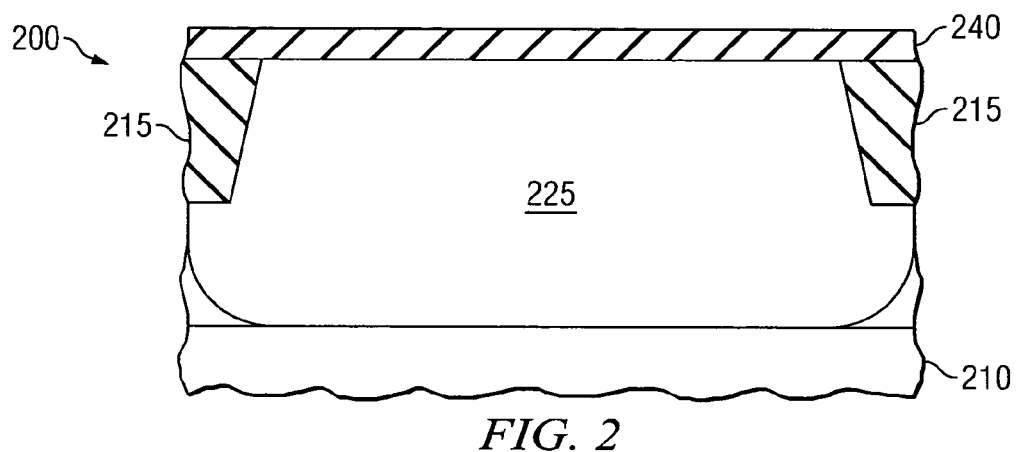
FIG. 2 illustrates sectional view of the n-channel transistor of FIG. 1 after formation of the dielectric layer but prior to being subjected to a nitridation process.

Gate dielectric 140 is of particular interest in the context of the present invention. In FIG. 2, a semiconductor substrate 210 is shown in cross section 200 after formation of gate dielectric 240. Gate dielectric 240 is shown overlying well 225 and isolation regions 215, and its thickness may vary depending on application and design parameters. In one embodiment, however, the thickness of the gate dielectric 240 may range from about 0.7 nm to about 3 nm with a typical thickness being about 2 nm. Gate dielectric 240 may comprise silicon and oxygen, and may be conventionally grown as a thermal oxide of the semiconductor substrate 210, i.e. silicon dioxide if a silicon substrate is used. Other processes, such as plasma or CVD depositional processes may also be used to form the gate dielectric 240. Moreover, it should be understood that other types of dielectrics known to those skilled in the semiconductor manufacturing art may also be used to form the gate dielectric.

Figure 3:
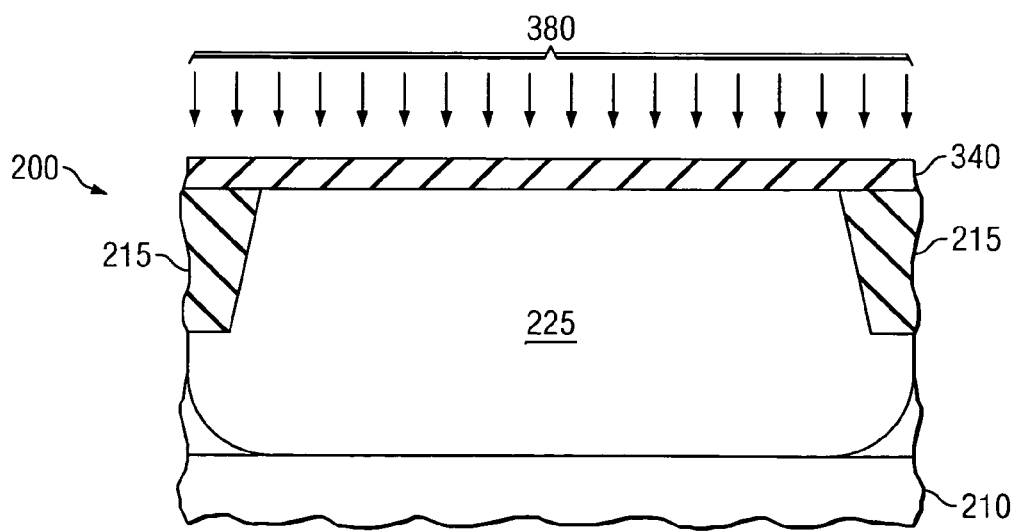
FIG. 3 illustrates sectional view of the n-channel transistor of FIG. 1 following the formation of a gate dielectric layer as it is being subjected to a nitridation process.

When the gate dielectric comprises silicon and oxygen, as is the case when thermally grown silicon dioxide is used, it is difficult to form a defect-free gate dielectric at the thickness required by the design gate voltage. In order to allow a thicker gate to be used, thereby reducing the defect level, the gate dielectric permittivity may be increased by incorporating nitrogen into the dielectric layer. Methods to do this include, but are not limited to, incorporation by treatment with a plasma which comprises nitrogen. There is illustrated in FIG. 3 the semiconductor substrate 210 of FIG. 2 undergoing a conventional nitridation process. FIG. 3 illustrates a nitrogen flux 380 directed toward the surface of the gate dielectric layer 240 of FIG. 2 to form a nitrided gate dielectric 340, which overlies well 225 and isolation regions 215.

In FIG. 4, graph 400 shows the concentration in atomic percent (at. %) of oxygen and nitrogen, acquired by ion milling, in an exemplary gate comprising these elements in addition to silicon. Plot 410 shows oxygen comprising about 25 at. % of the gate dielectric, while plot 420 shows nitrogen comprising about 8 at. %. The thickness of this exemplary gate is about 2 nm. Though substantially uniformly distributed in the gate, the incorporated nitrogen may not occupy stable bonding sites in the gate dielectric, resulting in loss of nitrogen from the gate dielectric over time.

Subsequent to the nitridation step, the nitrided gate dielectric is subjected to an anneal at low pressure. In one embodiment, the anneal may be performed as a separate process step immediately following nitridation. Those skilled in the art will recognize that alternate embodiments include an in situ anneal after nitridation, anneal in a separate chamber of a process tool, which includes a nitridation chamber and an anneal chamber, or an anneal incorporated into a subsequent process step, such as a thermal pretreatment prior to gate deposition. These alternate embodiments are illustrative of some of the options available to implement a gate dielectric anneal and is not an exhaustive list. It should also be understood that any thermal anneal process that has the effect of stabilizing nitrogen in the gate dielectric is within the scope of this invention.

Some of the more salient processing parameters of the anneal, in advantageous embodiments, include temperature, time, and processing ambient. In one embodiment, the anneal temperature may range from about 850° C. to about 1100° C., with about 900° C. being preferred to provide process margin while minimizing undesirable diffusion effects. With respect to time, the anneal may be implemented in as few as about 5 seconds, though the anneal may be as long as about 60 seconds without causing undesirable movement of dopants. The shorter times of around 15 seconds can be used when the gate dielectric is relatively thin or around about 2 nm. In a preferred embodiment, the annealing time is about 15 seconds, which provides sufficient process margin for the anneal, but minimizes the thermal budget of the process.

As mentioned above, the anneal is conducted at low pressure. It has been found that conducting the anneal at low pressure has a beneficial effect on the properties of the transistor after the integrated circuit is complete. In one embodiment, however, the anneal includes annealing in the presence of an annealing gas, and in certain advantageous embodiments forms a portion of a gas mixture. The gas mixture may consist of a substantially pure gas or may comprise the annealing gas and a carrier gas that has no substantial chemical activity in the process. Those skilled in the art will recognize that gasses that meet this definition include, but are not limited to, helium, argon and other noble gases, as well as other non-noble gases that are stable under process conditions. In an advantageous embodiment, nitrogen is substantially excluded as a carrier gas, although small trace amounts may be present in the gas mixture. The pressure of the gas mixture can be as low as the lowest controllable pressure of the anneal chamber. In an exemplary embodiment, the pressure may range from about 0.5 Torr to about 5 Torr, with about 0.5 Torr being preferred. However, pressures below 0.5 Torr down to the vacuum limits of the equipment are also within the scope of the present invention.

Preferably, the annealing gas is oxygen that in certain embodiments, may be combined with a carrier gas to form a gas mixture. As mentioned above, it is preferred that the gas mixture have relatively little to no nitrogen present. The concentration of oxygen in the gas mixture may range from about 80% to about 100%, with about 100% being the preferred value, while the carrier gas concentration can range from about 0% to about 20%, with about 0% being the preferred value.

Turning to FIG. 5, the $V_t$ shift after thermal and voltage stress of three test p-channel MOSFET transistors is shown in graph 500. Bar 510 shows a $V_t$ shift of about 110 mV for a transistor with no PNA. Bar 520 shows a $V_t$ shift of about 140 mV for a transistor with a gate annealed at 900° C. for 15 seconds in a 50 Torr ambient comprising about 20% oxygen and 80% nitrogen. The transistor represented by bar 530 was also annealed at 900° C. for 15 seconds, but in 100% oxygen at 0.5 Torr, and shows a $V_t$ shift of only about 80 mV.

The reduction of $V_t$ shift using the preferred embodiment is a significant and useful result. Depending on the requirements of the finished transistor device, the $V_t$ resulting from this invention may be sufficiently low that no modification of process steps after PNA is necessary, or the invention may be used in combination with other process changes to result in a $V_t$ shift which meets the requirements of the technology.

Figure 6:
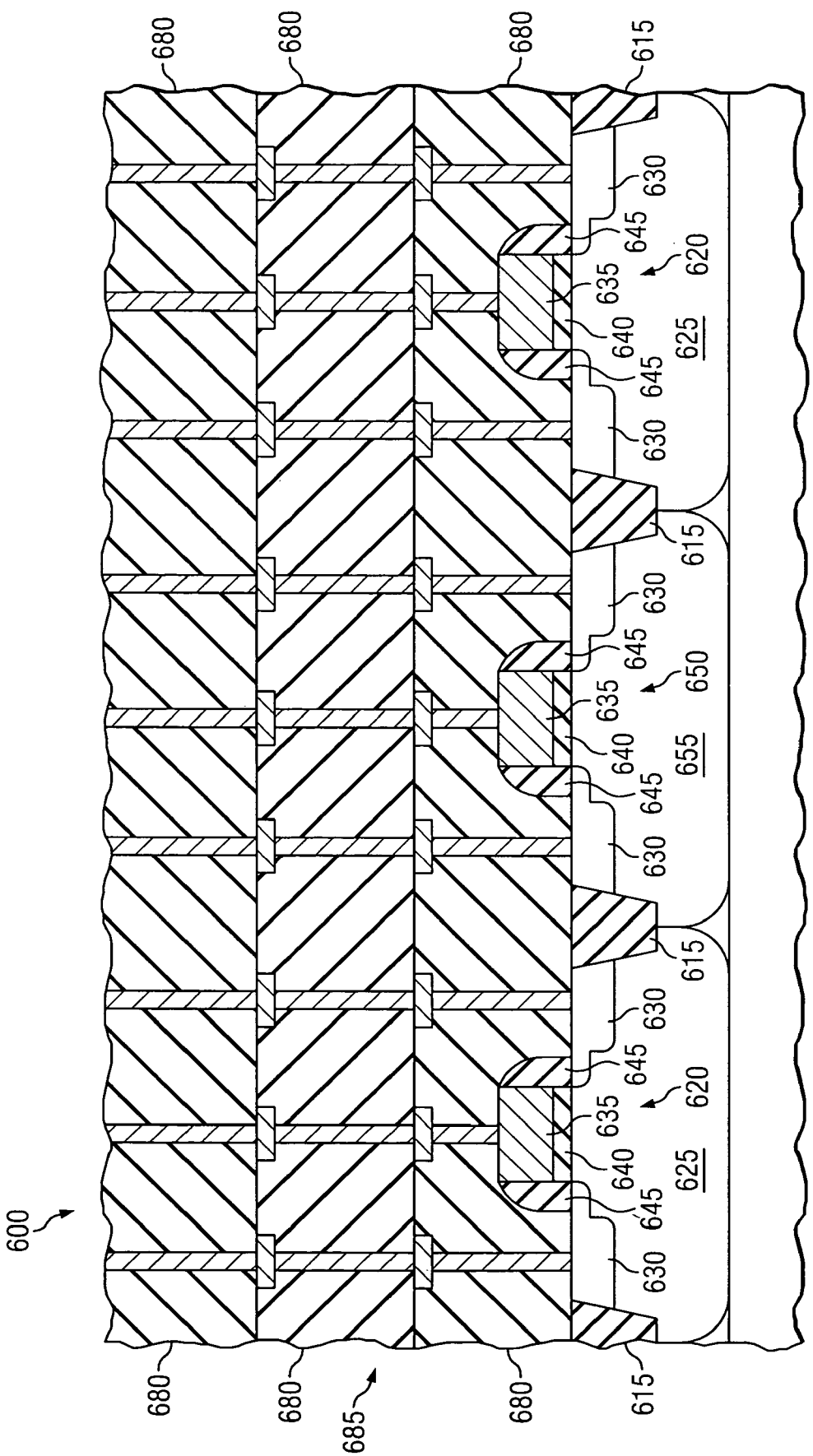
FIG. 6 illustrates a partial view of a MOSFET integrated circuit device that can be fabricated in accordance with the principles of the present invention.

FIG. 6 represents a partial view of a complementary MOSFET integrated circuit device 600 that can be fabricated in accordance with the principles of the present invention. The integrated circuit 600 includes p-channel transistors 620 and n-channel transistor 650, each having a gate 635, sidewall spacers 645, and gate dielectric 640. The gate dielectric 640 is a nitrided gate dielectric fabricated according to the principles of the present invention.

The transistors 620 and 650 also each includes source/drains 630 formed in wells 625 and 655, respectively, which can be doped as desired. Conventional isolation structures 615 separate and electrically isolate the transistors 620 and 650 from each other. Interlevel dielectric layers 680 are located over the transistors 620 and 650 and interconnects 685 are formed therein to interconnect the various transistors 620 and 650 to form an operative integrated circuit. Given the teachings of present application, one who is skilled in the art would know how to form the operative integrated circuit as shown in FIG. 6.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
   forming a nitrided dielectric layer on a semiconductor substrate; and
   subjecting the nitrided dielectric layer to an anneal at low pressure in an ambient that substantially excludes nitrogen.

2. The method as recited in claim 1 wherein the subjecting includes subjecting the nitrided dielectric layer to an anneal in the presence of an annealing gas and at the low pressure.

3. The method as recited in claim 2 wherein the annealing gas forms a portion of a gas mixture that substantially excludes nitrogen.

4. The method as recited in claim 2 wherein the annealing gas forms a portion of a gas mixture that includes a carrier gas, wherein a concentration of the annealing gas ranges from about 80% to about 100% and a concentration of the carrier gas ranges from about 0% to about 20%.

5. The method as recited in claim 2 wherein the annealing gas is oxygen and the nitrided dielectric layer comprises silicon and oxygen.

6. The method as recited in claim 5 wherein the annealing gas forms a portion of a gas mixture that includes a carrier gas, wherein a concentration of the oxygen ranges from about 80% to about 100% and a concentration of the carrier gas ranges from about 0% to about 20%.

7. The method as recited in claim 1 wherein the low pressure ranges from about 0.5 torr to about 5 torr.

8. The method as recited in claim 1 wherein the subjecting is conducted for a period of time ranging from about 5 seconds to about 60 seconds.

9. The method as recited in claim 1 wherein the annealing is conducted at a temperature ranging from about 850 EC to about 1100 EC.

10. The method as recited in claim 1 wherein forming the nitrided dielectric layer includes forming a nitrided gate dielectric by a plasma nitridation process.

11. The method as recited in claim 1 wherein the subjecting includes subjecting the nitrided dielectric layer to an anneal in the presence of a gas mixture that includes a carrier gas and an annealing gas, comprising oxygen, and that substantially excludes nitrogen, and wherein a concentration of the oxygen in the gas mixture ranges from about 80% to about 100% and a concentration of the carrier gas in the gas mixture ranges from about 0% to about 20%, and the low pressure ranges from about 0.5 torr to about 5 torr.

12. The method as recited in claim 11 wherein the annealing is conducted at a temperature ranging from about 850 EC to about 1100 EC.

13. A method of manufacturing an integrated circuit, comprising:
   forming a nitrided gate dielectric layer on a semiconductor substrate;
   subjecting the nitrided gate dielectric layer to an anneal at low pressure in an ambient that substantially excludes nitrogen to form an annealed gate dielectric layer;

forming a gate layer over the annealed gate dielectric layer;

forming wells and source/drains in the semiconductor substrate;

patterning the gate layer and the annealed gate dielectric layer to form transistor gates;

placing dielectric layers over the transistor gates; and forming interconnects in the dielectric layers that interconnect the transistor gates to form an operative integrated circuit.

14. The method as recited in claim 13 wherein the subjecting includes subjecting the nitrided dielectric layer to an anneal in the presence of an annealing gas and at the low pressure.

15. The method as recited in claim 14 wherein the annealing gas forms a portion of a gas mixture that substantially excludes nitrogen.

16. The method as recited in claim 14 wherein the annealing gas forms a portion of a gas mixture that includes a carrier gas wherein a concentration of the annealing gas ranges from about 80% to about 100% and a concentration of the carrier gas ranges from about 0% to about 20%.

17. The method as recited in claim 14 wherein the annealing gas is oxygen and the nitrided gate dielectric layer comprises silicon and oxygen.

18. The method as recited in claim 17 wherein the subjecting includes subjecting the nitrided dielectric layer to an anneal in the presence of a gas mixture that includes a carrier gas and the annealing gas, and that substantially excludes nitrogen, and wherein a concentration of the oxygen in the gas mixture ranges from about 80% to about 100% and a concentration of the carrier gas in the gas mixture ranges from about 0% to about 20%, and the low pressure ranges from about 0.5 torr to about 5 torr.

19. The method as recited in claim 13 wherein the subjecting is conducted for a period of time ranging from about 5 seconds to about 60 seconds.

20. The method as recited in claim 13 wherein the annealing is conducted at a temperature ranging from about 850 EC to about 1100 EC.

21. The method as recited in claim 13 wherein forming the nitrided dielectric layer includes forming a nitrided gate dielectric by a plasma nitridation process.

* * * * *